United States Patent [19]

Saito et al.

[11] Patent Number: 5,051,808
[45] Date of Patent: Sep. 24, 1991

[54] SEMICONDUCTOR DEVICE WITH LOW INDUCTANCE OF WIRINGS CONNECTING INDIVIDUAL ELEMENTS OF THE DEVICE

[75] Inventors: Akira Saito; Naoki Kumagai, both of Yokosuka, Japan

[73] Assignee: Fuji Electric Co., Ltd., Kawasaki, Japan

[21] Appl. No.: 529,853

[22] Filed: May 29, 1990

[30] Foreign Application Priority Data

Jul. 24, 1989 [JP] Japan .................................. 1-134407
Jul. 24, 1989 [JP] Japan .................................. 1-191091

[51] Int. Cl.$^5$ .......................................... H01L 27/02
[52] U.S. Cl. .................................. 357/41; 357/23.7; 357/43; 357/46
[58] Field of Search .................... 357/23.7, 41, 43, 46

[56] References Cited

U.S. PATENT DOCUMENTS 4,901,124 2/1990 Seki ...................................... 357/43

Primary Examiner—Edward J. Wojciechowicz
Attorney, Agent, or Firm—Brumbach, Graves, Donohue & Raymond

[57] ABSTRACT

A semiconductor device having the function of a conductivity-modulation type MOSFET with improved switching speed is disclosed, which device has low inductance of wirings connecting individual elements of the device. The elements forming the semiconductor device are connected by short, deposited wirings in the silicon substrate or on the silicon substrate, thereby minimizing the inductance of the wiring.

18 Claims, 3 Drawing Sheets

SEMICONDUCTOR DEVICE WITH LOW INDUCTANCE OF WIRINGS CONNECTING INDIVIDUAL ELEMENTS OF THE DEVICE

BACKGROUND OF THE INVENTION

This invention relates to a semiconductor device having the function of a conductivity-modulation type MOSFET combined with a bipolar transistor, which semiconductor device minimizes inductance of wiring connections between individual elements of the semiconductor device.

FIG. 2 represents a circuit combining MOSFETs with a bipolar transistor for realizing bipolar operation of the circuit. In FIG. 2, a first n-channel MOSFET 21 is connected between an emitter and an emitter terminal E of an NPN bipolar transistor 20. A second n-channel MOSFET 22 and a third n-channel MOSFET 23 are connected in series between the emitter terminal E and a collector terminal C. In addition, the gates of the first MOSFET 21 and the third MOSFET 23 are connected to a common gate terminal G. Finally, the gate of the second MOSFET 22 is connected to a connecting point of the drain of the second MOSFET 22 and the source of the third MOSFET 23, and this connecting point is in turn connected to the base of the bipolar transistor 20.

Application of a constant voltage equal to or greater than the threshold voltage to the common gate terminal G of the first and the third n-channel MOSFETs 21 and 23 causes both MOSFETs to become conductive. When these MOSFETs become conductive, a base current flows into the base layer of the NPN transistor 20, causing a heavy current to flow between the terminals C and E of the NPN transistor 20. When the MOSFETs 21 and 23 are subsequently turned OFF while a heavy current flows in the transistor 20, the voltage applied to the gate of the second MOSFET 22 increases due to an excessive quantity of holes in the transistor 20. This causes a conductivity modulation to occur, whereby the MOSFET 22 becomes conductive. Consequently, the holes in the transistor 20 are extracted through the MOSFET 22, resulting in an increased switching speed of the transistor 20 in comparison to a circuit of FIG. 2 without the MOSFET 22.

FIG. 3 represents another circuit combining MOSFETs with a bipolar transistor for realizing bipolar operation of the circuit. In this circuit, a p-channel MOSFET 24 is utilized instead of the second n-channel MOSFET 22 of FIG. 2, and the gate of the MOSFET 24 is connected to the gate terminal G in common with the gates of the first n-channel MOSFET 21 and the third n-channel MOSFET 23.

Application of a constant voltage equal to or greater than the threshold voltage to the common gate terminal G of the n-channel MOSFETs 21 and 23 and the p-channel MOSFET 24 causes the n-channel MOSFETs 21 and 23 to become conductive and the p-channel MOSFET 24 to become nonconductive. When the MOSFETs 21 and 23 become conductive, a base current flows into the base layer of the NPN transistor 20, and a heavy current flows between the terminals C and E of the transistor 20. Subsequently, when the voltage applied to the gate terminal G is gradually lowered while the transistor 20 is conductive, the MOSFETs 21 and 23 become nonconductive and the MOSFET 24 becomes conductive. Consequently, the holes in the transistor 20 are extracted through the MOSFET 24, resulting in an increased switching speed of the transistor 20 in comparison to a circuit of FIG. 3 without the MOSFET 24.

The circuits shown in FIGS. 2 and 3 produce voltage spikes and oscillations during the switching period due to inductance of wirings connecting individual elements of the semiconductor device. Consequently, expected characteristics of the semiconductor device cannot be fully obtained.

It is an object of the present invention to provide a semiconductor device having the function of a conductivity-modulation type MOSFET with reduced turn-OFF time, which device has extremely small inductance of wiring connections between individual elements of the semiconductor device, thereby eliminating voltages spikes and oscillation during switching operation.

SUMMARY OF THE INVENTION

In accordance with the present invention, two MOSFETs are utilized to supply a base current to the base of a bipolar transistor, and another MOSFET is utilized to extract the current carriers from the base of the bipolar transistor when the bipolar transistor is conducting. The elements forming this circuit are connected by short, deposited wirings in the silicon substrate or on the silicon substrate, thereby minimizing inductance of the wirings.

Further, in accordance with the present invention, a semiconductor device is provided which comprises a transistor device having a first surface including portions of a high-impurity density emitter region of a first conductive type, a base region of a second conductive type, and a low-impurity density collector region of the first conductive type, said base and collector surface portions connecting to the base and collector region layers lying below the emitter region layer, said surface additionally including a high-impurity density base-contact region of the second conductive type and a high-impurity density source region of the first conductive type within said base surface portion. The semiconductor device further comprises an insulating film of a first thickness disposed on surface portions of said emitter, base, and base contact regions; a gate-insulating film of a second thickness extending over said base and collector surface portions and said source region; a common-source region of the first and second MOSFETs of a high-impurity density of the first conductive type disposed on said insulating film of the first thickness; a drain region of the first MOSFET of a high-impurity density of the first conductive type disposed on said insulating film of the first thickness; a channel-forming region of the first MOSFET of the second conductive type disposed on said insulating film of the first thickness, said channel-forming region of the first MOSFET interposed between said source region and said drain region of the first MOSFET; a drain region of the second MOSFET of a high-impurity density of the first conductive type disposed on said insulating film of the first thickness; a channel-forming region of the second MOSFET of the second conductive type disposed on said insulating film of the first thickness, said channel-forming region of the second MOSFET interposed between said source region and said drain region of the second MOSFET; a gate-insulating film of the second thickness disposed on each of said channel regions of the first and the second MOSFETs; a gate disposed on each of said channel regions of the first and the second MOSFETs via said gate-insulating film of the second thickness; the gate of a third MOSFET device disposed on said gate-insulating film of the second thickness extending over said base and collector surface portions and said source region; and the third MOSFET further comprising said base surface portion as the channel forming region, said collector surface portion as the drain region, and said source region. The common-source region of the first and second MOSFETs are connected to an emitter terminal; the drain region of the first MOSFET is connected to said emitter region; the drain region of the second MOSFET is connected to said base-contact layer of the semiconductor substrate and the source region of the third MOSFET; the gates of the first and third MOSFETs are connected to a common-gate terminal; the gate of the second MOSFET is connected to the drain region of said second MOSFET; and the collector contact layer is connected to the collector terminal.

Further in accordance with the present invention, another semiconductor device is provided which comprises a transistor device having a first surface including portions of a high-impurity density emitter region of a first conductive type, a base region of a second conductive type, and a low-impurity density collector region of the first conductive type, said base and collector surface portions connecting to the base and the collector region layers lying below the emitter region layer, said surface additionally including a high-impurity density base-contact region of the second conductive type and a high-impurity density source region of the first conductive type within said base surface portion. This semiconductor device further comprises an insulating film of a first thickness disposed on surface portions of said emitter, base, and base-contact regions; a gate-insulating of a second thickness extending over said base and collector surface portions and said source region; the source region of the first MOSFET of a high-impurity density of the first conductive type; the source region of the second MOSFET of a high-impurity density of the second conductive type; said source regions of the first and the second MOSFETs disposed on said insulating film of first thickness; a drain region of the first MOSFET of a high-impurity density of the first conductive type disposed on said insulating film of first thickness; a channel-forming region of the first MOSFET of the second conductive type disposed on said insulating film of first thickness, said channel-forming region of the first MOSFET interposed between said source region and said drain region of the first MOSFET; a drain region of the second MOSFET of a high-impurity density of the second conductive type disposed on said insulating film of first thickness; a channel-forming region of the second MOSFET of the first conductive type disposed on said insulating film of the first thickness, said channel-forming region of the second MOSFET interposed between said source region and said drain region of the second MOSFET; a gate-insulating film of the second thickness disposed on each of said channel regions of the first and the second MOSFETs; a gate disposed on each of said channel regions of the first and the second MOSFETs via said gate-insulating film of the second thickness; the gate of a third MOSFET disposed on said gate-insulating film of the second thickness extending over said base and collector surface portions and said source region; the third MOSFET further comprising said base surface portion as the channel-forming region, said collector surface portion as the drain region, and said source region; the source regions of the first and the second MOSFETs connected to an emitter terminal; the drain region of the first MOSFET connected to said emitter region; the drain region of the second MOSFET connected to said base-contact layer of the semiconductor substrate; the gates of all three MOSFETs connected to a common-gate terminal; and the collector contact layer connected to a collector terminal.

DESCRIPTION OF THE PREFERRED EMBODIMENTS

Figure 1A:
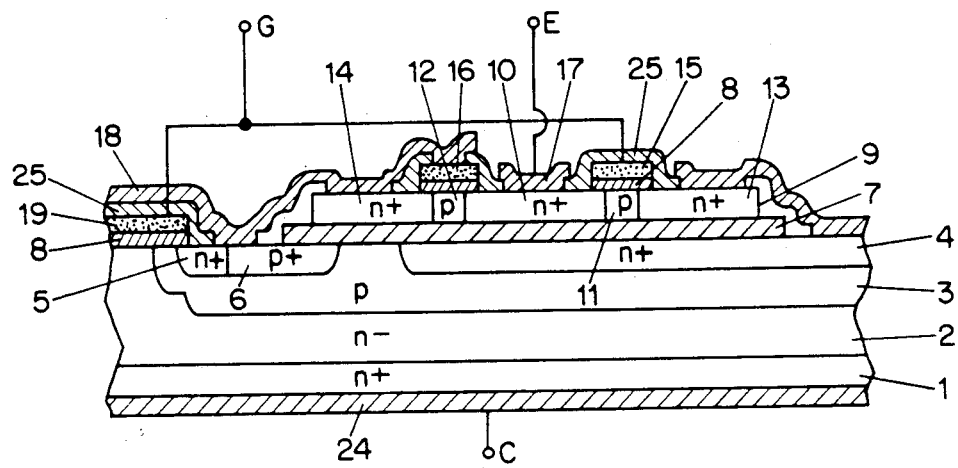
FIG. 1(a) is a cross-sectional view show principal parts of an embodiment of the present invention.

FIG. 1(a) shows a semiconductor device as an embodiment of the present invention. An n$^-$layer 2, the collector region, having an impurity concentration of $10^{14}$ cm$^{-3}$ is epitaxially grown to a thickness of 20~30 $\mu$m on the n$^{30}$ silicon layer 1, the collector contact layer, which has an impurity concentration of $10^{19}$ cm$^{-3}$ with a thickness of 500 $\mu$m. A p-type base region 3 having a surface impurity concentration of $10^{16}$ cm$^{-3}$ is formed in a thickness of 5 $\mu$m by impurity diffusion from the surface of the collector region 2. Similarly, an n$^+$emitter region 4, an n$^+$source region 5, and a p$^+$base contact region 6, all having a surface impurity concentration of $10^{19}$ cm$^{-3}$ and a depth of 1~2 $\mu$m, are formed by impurity diffusion from the surface of the base region 3.

On this silicon substrate, an oxide film 7 of 1 $\mu$m thickness is formed as an interlayer insulating film, and an oxide film 8 of 0.1 $\mu$m thickness is formed as a gate oxide film extending from the source region 5 to the collector region 2 by the low-pressure, CVD film-forming method and the patterning process. Subsequently, a polycrystal silicon film of 0.5 $\mu$m thickness is formed on the oxide film 7. Then, the polycrystal silicon film is transformed by the laser annealing process to a single crystal silicon layer 9.; An n$^+$source region 10, p regions 11 and 12, the channel-forming regions, and n$^+$drain regions 13 and 14 are formed by impurity diffusion into the silicon layer 9. Thereafter, the gate oxide film 8 is disposed on the p regions 11 and 12, and the polycrystal silicon gates 15 and 16 are provided over the p regions 11 and 12, respectively, via the gate oxide film 8.

Figure 2:
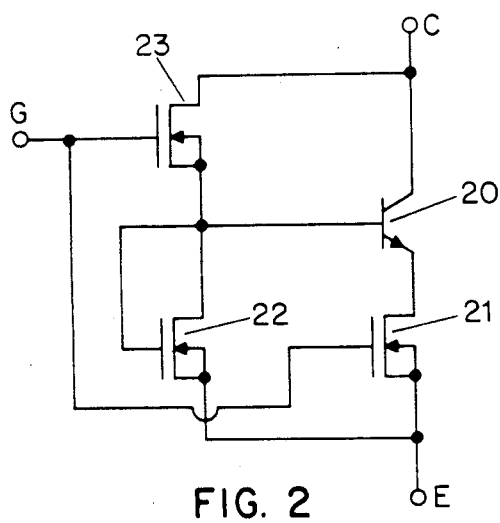
FIG. 2 is a circuit diagram showing an equivalent circuit of the embodiment of the present invention shown in FIG. 1(a)

A first MOSFET, corresponding to the MOSFET 21 of FIG. 2, consisting of the source region 10, the channel-forming region 11, the drain region 13, and the gate 15, is connected between the emitter terminal E and the emitter region 4. This is accomplished by connecting the source region 10 to the emitter terminal E via an emitter electrode 17 consisting of Al-Si alloy, and connecting the drain region 13 to the emitter region 4 via a deposited wiring 18, also consisting of Al-Si alloy.

A second MOSFET, corresponding to the MOSFET 22 of FIG. 2, consisting of the source region 10, the channel-forming region 12, the drain region 14, and the gate 16, is connected between the emitter terminal E and the p base region 3. This is accomplished by connecting the drain region 14 to the p+base-contact layer 6 via the deposited wiring 18, and connecting the gate 16 to the drain region 14 and the p base-contact layer 6 via the deposited wiring 18.

A third MOSFET, corresponding to the MOSFET 23 of FIG. 2, comprise a gate 19 disposed on the gate oxide film 8 extending from the collector region 2 to the n+source region 5, the surface portion the collector region 2 as the drain region, and the surface portion of p base region 3 interposed between the drain region and the source region 5 as the channel-forming region.

The source region 5 is connected to the drain region 14 and the gate 16 via the deposited wiring 18. In addition, the n+collector-contact layer 1 is connected to the collector terminal C via a collector electrode 24 consisting of Al-Si alloy. Finally, the gates 15 and 19 are connected to the common-gate terminal G, thereby completing a semiconductor device corresponding to the equivalent circuit of FIG. 2.

Connections between the elements forming the circuit of FIG. 2 are made by short deposited wirings in the silicon substrate or on the substrate, thereby minimizing the inductance of the conductors. A PSG layer 25 is inserted as shown in FIG. 1(a) for insulation of conductors 18.

Figure 1B:
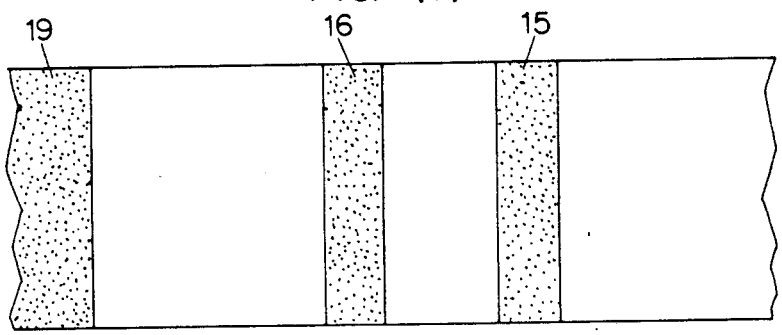
FIG. 1(b) is a top view showing the gate pattern of the embodiment of the present invention shown in FIG. 1(a)
Figure 1C:
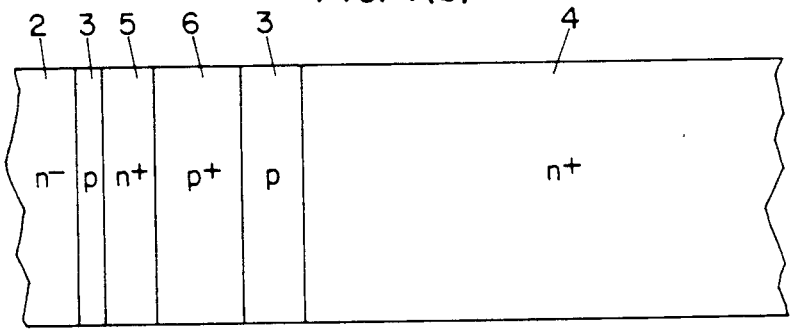
FIG. 1(c) is a top view showing the semiconductor substrate surface of the embodiment of the present invention shown in FIG. 1(a)

FIG. 1(b) is a top view of the semiconductor device shown in FIG. 1(a), showing the pattern of the polycrystal silicon gates 15, 16 and 19. FIG. 1(c) is a top view of the semiconductor-substrate surface showing the n+emitter region 4, the p base region 3, the p+base-contact layer 6, the n+source region 5, and the n-layer 2 All of the gates, regions, and layers are formed extending in parallel along the surface plane of the semiconductor device.

Figure 4:
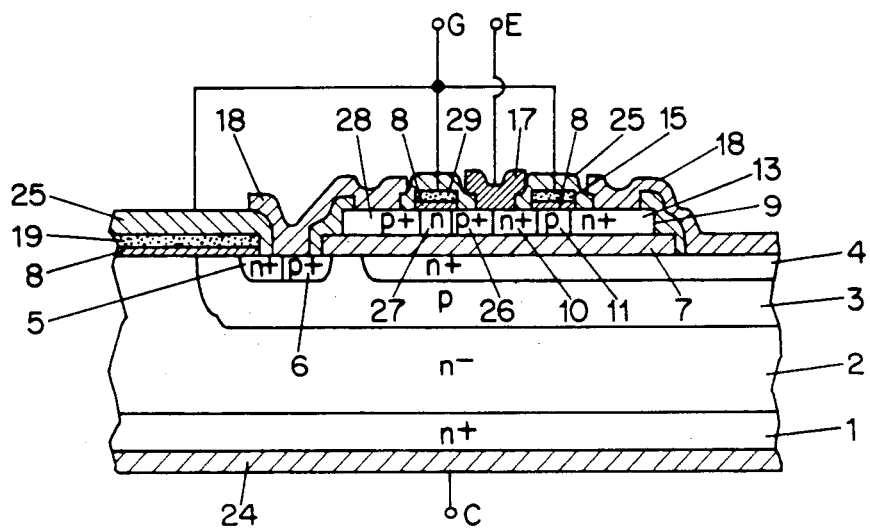
FIG. 4 is a cross-section view showing principal parts of another embodiment of the present invention.

FIG. 4 shows a cross-sectional view of a semiconductor device as another embodiment of the present invention. Components similar to those shown in FIG. 1(a) are designated by the like numerals After forming the silicon substrate as described for the semiconductor device of FIG. 1(a), impurities are diffused into the silicon layer 9 to form the n+regions 10 and 13, the p region 11 interposed between the n+regions 10 and 13, the p+regions 26 and 28, and the n region 27 interposed between the p+regions 26 and 28.

Subsequently, the polycrystal silicon gates 15 and 29 are disposed on the p region 11 and the n region 27, respectively, via the gate oxide film 8. The p region 11 and the n region 27 are the channel-forming regions, while the n+region 10 and the p+region 26 are the source regions. The n+region 13 and the p+region 28 are the drain regions.

Figure 3:
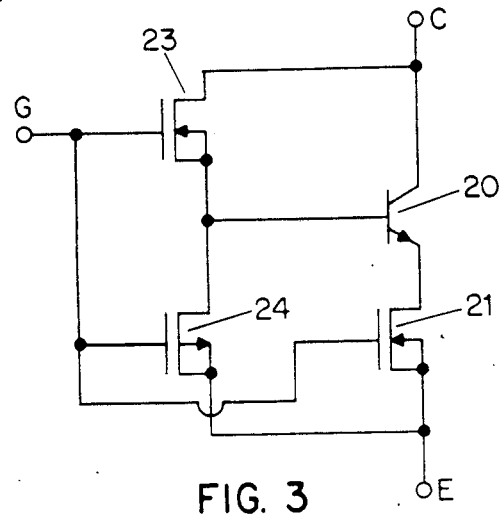
FIG. 3 is a circuit diagram showing an equivalent circuit of the embodiment of the present invention shown in FIG. 4.

The first MOSFET, corresponding to the MOSFET 21 of FIG. 3, consisting of the source region 10, the channel-forming region 11, the drain region 13, and the gate 15, is connected between the emitter terminal E and the emitter region 4. This is accomplished by connecting the source regions 10 and 26 to the emitter terminal E via the emitter electrode 17, and connecting the drain region 13 to emitter region 4 via the deposited wiring 18. In addition, the gate 15 is connected to the gate terminal G.

The second MOSFET, corresponding to the p-channel MOSFET 24 of FIG. 3, consisting of the source region 26, the channel-forming region 27, the drain region 28, and one gate 29, is connected between the emitter terminal E and the p base region 3. This is accomplished by connecting the drain region 28 to the p+base-contact layer 6 via the wiring 18. In addition, the gate 29 is connected to the gate terminal G.

The third MOSFET, corresponding to the MOSFET 23 of FIG. 3, consists of the same elements as the MOSFET 23 of FIG. 1(a). The gate 19 is connected to the gate terminal G, thereby completing a semiconductor device corresponding to the equivalent circuit of FIG. 3. Once again, connections between the elements forming the circuit are made by the short deposited wirings 18 in the silicon substrate or on the substrate.

Figure 5A:
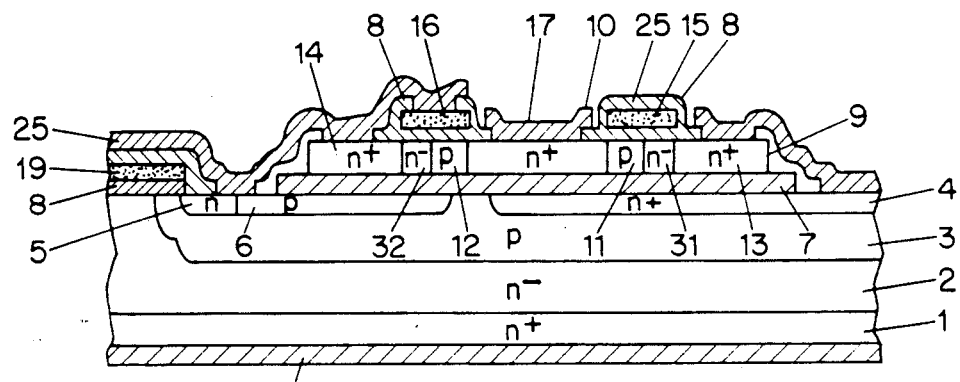
FIG. 5(a) is a cross-sectional view showing principal parts of yet another embodiment of the present invention.
Figure 5B:
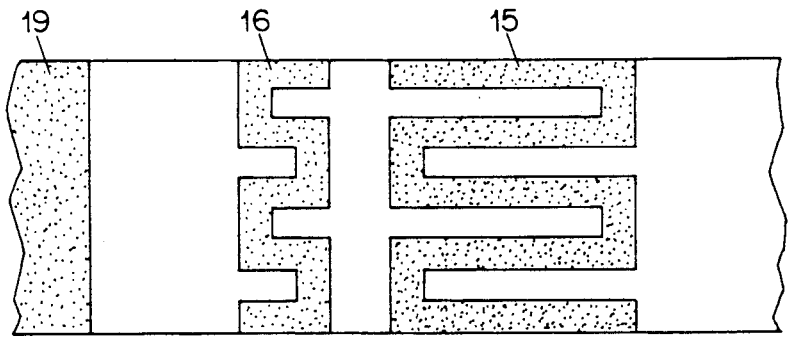
FIG. 5(b) is a top view showing the gate patters of the embodiment of the present invention shown in FIG. 5(a)
Figure 5C:
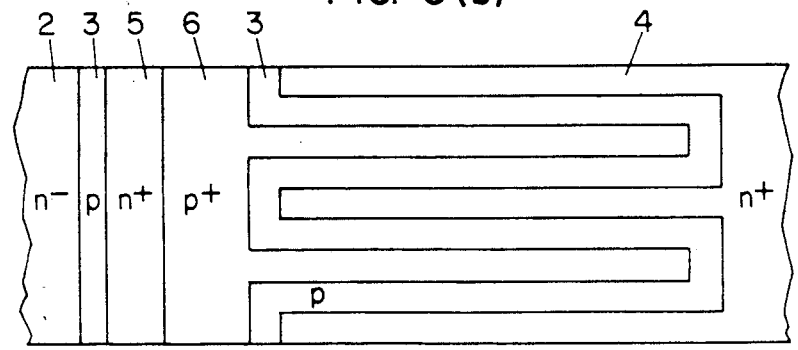
FIG. 5(c) is a top view showing the semiconductor substrate surface of the embodiment of the present invention shown in FIG. 5(a)

FIG. 5(a) shows a cross-sectional view of a semiconductor device as yet another embodiment of the present invention. Once again, components similar to those shown in FIGS. 1(a) and 3 are designated by the like numerals. FIG. 5(b) is a to view of the semiconductor device shown in FIG. 5(a), showing the pattern of the polycrystal silicon gates 15, 16 and 19. FIG. 5(c) is a top view of the semiconductor-substrate surface showing the n+emitter region 4, the p base region 3, the p+base-contact layer 6, the n+source region 5, and the n-layer 2.

An equivalent circuit of the semiconductor device of the embodiment shown in FIG. 5(a) is FIG. 2. However, the gates 15 and 16, which are formed in parallel as the rectangular areas in FIG. 1(b), are formed in the form of a comb as shown in FIG. 5(b). Under the gate 15 an n-layer 31 is formed between the p region 11, the channel-forming region, and the n+drain region 13. Under the gate 16 an n-layer 32 is formed between the p region 12, the channel-forming region, and the n+drain region 14.

As shown in FIG. 5(b), the area occupied by the gate 15 is larger than the are occupied by the gate 16 by making the comb shape of the gate 15 larger. The channel-forming regions 11 and 12 located under the gates are also formed in the shape of a comb and the area of the region 11 is larger than that of the region 12.

The ON resistance of the semiconductor devices represented in FIGS. 2 and 3 consists mainly of the resistance of the first MOSFET 21 connected in series with the bipolar transistor. When the semiconductor device is ON, the second MOSFET 22 or 24 is OFF, whereby the resistance of the MOSFET 22 or 24 is low. Consequently, the gate-insulating film of the MOSFET 22 or 24 experiences dielectric breakdown due to skipped voltages when the base current is extracted through the MOSFET 22 or 24. Since the area of the gate of the first MOSFET 21 and the channel forming region thereunder is larger than the area of the gate of the second MOSFET 22 or 24 and the channel-forming region thereunder, the resistance of the MOSFET 21 is reduced. The resistance of a MOSFET is reduced by increasing the ratio W/L, wherein L is the channel length and W is the channel width. The ratio is increased by utilizing the comb-type structure. Consequently, the ON resistance of the semiconductor device is reduced.

When the ratio W/L increases, however, the dielectric strength between the n+region 13 and the p region 11, and between the n+region 14 and the p region 12, decreases. In order to achieve a low resistance ratio and to match the properties of the first MOSFET, the emitter region. In order to achieve a low resistance ratio and match the properties of said first MOSFET, the emitter region 4 of the bipolar transistor is interdigitally located between the exposed-surface area of the base region 3 in the form of a comb as shown in FIG. 5(c). Similarly, the base-contact layer 6 is interdigitally located between said exposed-surface area of the base region 3 as shown in FIG. 5(c).

Figure 6:
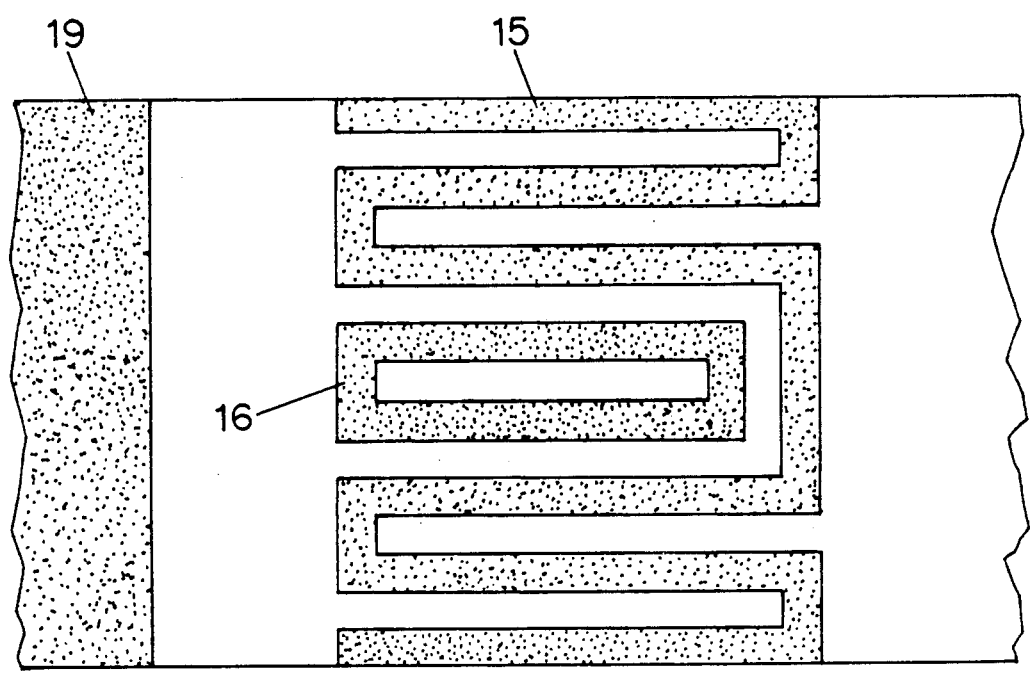
FIG. 6 is a top view showing the gate pattern of yet another embodiment of the present invention.

FIG. 6 shows the gate pattern of yet another embodiment of the present invention in which the polycrystal silicon gate 16 of the second MOSFET is periodically arranged between the comb shaped, polycrystal silicon gate 15 of the first MOSFET. The channel-forming regions under said gates 15 and 16 reflect the gate pattern. Consequently, difference of the areas of the channel-forming region 11 and 12 increases, whereby the ON resistance of the semiconductor device is reduced.

Different embodiments of the present invention may be readily obtained by inverting the conductive types of the drain, source, and channel regions of the embodiments described, thereby forming a device comprising a PNP bipolar transistor and three p-channel MOSFETs, or a device comprising a PNP bipolar transistor, two p-channel MOSFETs and one n-channel MOSFET.

While there have been described what are believed to be the preferred embodiments of the invention, those skilled in the art will recognize that other and further modifications may be made thereto without departing from the invention and it is intended to claim all such changes and modifications as fall within the scope of the invention.

We claim:

1. A semiconductor device comprising:
   a transistor device having a first surface including portions of emitter, base and collector regions, said base and collector surface portions connecting to base and collector region layers lying below an emitter region layer, said surface additionally including base contact and source regions within said base surface portion;
   an insulating film disposed on surface portions of said emitter, base and base contact regions;
   first and second MOSFET devices disposed on said insulating film comprising a first MOSFET drain region connected by deposited wiring to the emitter region of said transistor device, and a second MOSFET drain region connected to the source and the base contact regions of said transistor device by deposited wiring; and
   a third MOSFET device formed on a gate-insulation film over said base and collector surface portions and said source region;
   whereby said semiconductor device is usable as a switching circuit characterized by low inductance of said deposited wiring connections.

2. A semiconductor device according to claim 1, wherein said first and second MOSFET devices share a common source region, and said second MOSFET drain region is connected to a gate region of the second MOSFET by said deposited wiring connecting the second MOSFET drain region to said source and said base contact regions.

3. A semiconductor device according to claim 2 wherein said first, second, and third MOSFETs are n-channel MOSFETs, said transistor device is an NPN bipolar transistor, and the third MOSFET further comprises said base surface portion as the channel-forming region, said collector surface portion as the drain region, and said source region.

4. A semiconductor device according to claim 3, wherein the area of the gate of first MOSFET and a channel-forming region thereunder is larger than the area of the gate of second MOSFET and a channel-forming region thereunder.

5. A semiconductor device according to claim 4, wherein said first and second MOSFET gates are each in the form of a comb in the surface plane of the semiconductor device.

6. A semiconductor device according to claim 5, wherein an n⁻region is interposed between the channel-forming region and the drain region of each of said first and second MOSFETs.

7. A semiconductor device according to claim 4, wherein said second MOSFET gate is periodically arranged between said first MOSFET gate in the form of a comb in the surface plane of the semiconductor device.

8. A semiconductor device according to claim 7, wherein an n⁻region is interposed between the channel-forming region and the drain region of each of said first and second MOSFETs.

9. A semiconductor device according to claim 1, wherein said first and second MOSFET source regions are of opposite polarity, and the third MOSFET further comprises said base surface portion as the channel-forming region, said collector surface portion as the drain region, and said source region.

10. A semiconductor device according to claim 9, wherein said first and third MOSFETs are n-channel MOSFETs, said second MOSFET is a p-channel MOSFET, and said transistor device is an NPN bipolar transistor.

11. A semiconductor device according to claim 10, wherein the area of the gate of first MOSFET and a channel-forming region thereunder is larger than the area of the gate of second MOSFET and a channel-forming region thereunder.

12. A semiconductor device according to claim 11, wherein said first and second MOSFET gates are in the form of a comb in the surface plane of the semiconductor device.

13. A semiconductor device according to claim 12, wherein an n⁻region is interposed between the channel-forming region and the drain region of said first MOSFET, and a p⁻region is interposed between the channel-forming region and the drain region of said second MOSFET.

14. A semiconductor device according to claim 11, wherein said second MOSFET gate is periodically arranged between said first MOSFET gate in the form of a comb in the surface plane of the semiconductor device.

15. A semiconductor device according to claim 14, wherein an n⁻region is interposed between the channel-forming region and the drain region of said first MOSFET, and a p⁻region is interposed between the channel-forming region and the drain region of said second MOSFET.

16. A semiconductor device comprising:
a transistor device having a first surface including portions of a high-impurity density emitter region of a first conductive type, a base region of a second conductive type, and a low-impurity density collector region of the first conductive type, said base and collector surface portions connecting to the base and collector region layers lying below the emitter region layer, said surface additionally including a high-impurity density base-contact region of the second conductive type and a high-impurity density source region of the first conductive type within said base surface portion;
an insulating film of a first thickness disposed on surface portions of said emitter, base and base-contact regions;
a gate insulating film of a second thickness extending over said base and collector surface portions and said source region;
source regions of the first and second MOSFETs disposed on said insulating film of first thickness;
a drain region of the first MOSFET of a high-impurity density of the first conductive type disposed on said insulating film of first thickness;
a channel-forming region of the first MOSFET of the second conductive type disposed on said insulating film of first thickness, said channel-forming region of the first MOSFET interposed between said source region and said drain region of the first MOSFET;
a drain region of the second MOSFET disposed on said insulating film of first thickness;
a channel-forming region of the second MOSFET disposed on said insulating film of first thickness, said channel-forming region of the second MOSFET interposed between said source region and said drain region of the second MOSFET;
a gate-insulating film of the second thickness disposed on each of said channel regions of the first and second MOSFETs;
a gate disposed on each of said channel regions of the first and second MOSFETs via said gate-insulating film of the second thickness;
the gate of a third MOSFET device disposed on said gate-insulating film of the second thickness extending over said base and collector surface portions and said source region; and
the third MOSFET further comprising said base surface portion as the channel-forming region, said collector surface portion as the drain region, and said source region;
whereby said semiconductor device is usable as a switching circuit characterized by low inductance of said deposited wiring connections.

17. A semiconductor device according to claim 16, wherein said source regions of the first and second MOSFETs comprise a common-source region of a high impurity density of the first conductive type;
said drain region of the second MOSFET is of a high-impurity density of the first conductive type;
said channel-forming region of the second MOSFET is of the second conductive type;
the source regions of the first and second MOSFETs are connected to an emitter terminal;
the drain region of the first MOSFET is connected to said emitter region by short, deposited wiring;
the drain region of the second MOSFET is connected to said base-contact layer of the semiconductor substrate and the source region of the third MOSFET by short, deposited wiring;
the gates of the first and third MOSFETs are connected to a common-gate terminal;
the gate of the second MOSFET is connected to the drain region of said second MOSFET; and
the collector contact layer is connected to the collector terminal.

18. A semiconductor device according to claim 16, wherein said source region of the first MOSFET is of a high-impurity density of the first conductive type;
said source region of the second MOSFET is of a high-impurity density of the second conductive type;
said drain region of the second MOSFET is of a high-impurity density of the second conductive type;
said channel-forming region of the second MOSFET is of the first conductive type;
the source regions of the first and second MOSFETs are connected to an emitter terminal;
the drain region of the first MOSFET is connected to said emitter region by short, deposited wiring;
the drain region of the second MOSFET is connected to said base-contact layer of the semiconductor substrate by short, deposited wiring;
the gates of all three MOSFETS are connected to a common-gate terminal; and
the collector contact layer is connected to a collector terminal.

* * * * *

UNITED STATES PATENT AND TRADEMARK OFFICE
CERTIFICATE OF CORRECTION

PATENT NO. : 5,051,808

DATED : September 24, 1991

INVENTOR(S) : Saito et al.

It is certified that error appears in the above-identified patent and that said Letters Patent is hereby corrected as shown below:

Title page, item [30], 2nd line, "July 24, 1989" should read --May 26, 1989--;

Column 4, line 11, "show" should read --showing--;

Column 4, line 25, "cross-section" should read --cross-sectional--;

Column 4, line 42, "n-layer" should read --$n^-$ layer--;

Column 4, line 45, "$n^{30}$" should read --$n^+$--;

Column 8, line 25, "n-region" should read --$n^-$ region--;

UNITED STATES PATENT AND TRADEMARK OFFICE
CERTIFICATE OF CORRECTION

PATENT NO. : 5,051,808
DATED : September 24, 1991
INVENTOR(S) : Saito, et al It is certified that error appears in the above-identified patent and that said Letters Patent is hereby corrected as shown below:

Column 8, line 35, "n-region" should read --$n^-$ region--;

Column 8, line 59, "n-region" should read --$n^-$ region--;

Column 8, line 61, "p-region" should read --$p^-$ region--;

Column 9, line 2, "n-region" should read --$n^-$ region--;

Column 9, line 4, "p-region" should read --$p^-$ region--;

Signed and Sealed this

First Day of June, 1993

Attest:

MICHAEL K. KIRK

*Attesting Officer*     Acting Commissioner of Patents and Trademarks